US011683911B2

(12) United States Patent
Wöhlte (10) Patent No.: US 11,683,911 B2
(45) Date of Patent: Jun. 20, 2023

(54) VEHICULAR SENSING DEVICE WITH COOLING FEATURE

(71) Applicant: Magna Electronics Inc., Auburn Hills, MI (US)

(72) Inventor: Wilhelm Johann Wolfgang Wöhlte, Sailauf (DE)

(73) Assignee: Magna Electronics Inc., Auburn Hills, MI (US)

( * ) Notice: Subject to any disclaimer, the term of this patent is extended or adjusted under 35 U.S.C. 154(b) by 747 days.

(21) Appl. No.: 16/662,205

(22) Filed: Oct. 24, 2019

(65) Prior Publication Data

US 2020/0137926 A1 Apr. 30, 2020

Related U.S. Application Data

(60) Provisional application No. 62/750,894, filed on Oct. 26, 2018.

(51) Int. Cl.
*H05K 7/20* (2006.01)
*H05K 1/02* (2006.01)
*H05K 1/14* (2006.01)
*H01L 23/40* (2006.01)
*G01S 7/03* (2006.01)

(Continued)

(52) U.S. Cl.
CPC ............ *H05K 7/20436* (2013.01); *G01S 7/03* (2013.01); *G01S 7/4813* (2013.01); *H01L 23/40* (2013.01); *H05K 1/0284* (2013.01); *H05K 1/144* (2013.01); *H05K 7/205* (2013.01); *H05K 7/20518* (2013.01); *H05K 7/20854* (2013.01);

(Continued)

(58) Field of Classification Search
CPC ... H05K 7/20436–20445; H05K 7/205; H05K 7/208; H05K 7/54; H05K 1/144; H05K 1/0206; H05K 7/20854
See application file for complete search history.

(56) References Cited

U.S. PATENT DOCUMENTS 4,712,879 A   12/1987   Lynam et al.
5,393,931 A   2/1995    Guenther
(Continued)

FOREIGN PATENT DOCUMENTS

WO   WO-2004112129 A1 * 12/2004   ......... H01L 23/3677
WO   WO-2006109206 A2 * 10/2006   ......... H01L 23/3675
WO   2011090484 A1      7/2011

*Primary Examiner* — Robert J Hoffberg
(74) *Attorney, Agent, or Firm* — Honigman LLP (57) ABSTRACT

A sensing device for a vehicular sensing system includes a housing having a front housing portion and a metallic rear housing portion. A first printed circuit board and a second printed circuit board are disposed in the housing. The second printed circuit board is electrically connected to the first printed circuit board, which has an electrical connector for electrically connecting the sensing device to a vehicle wire harness. The second printed circuit board has circuitry thereat, with the circuitry generating heat when the sensing device is operating. The rear housing portion comprises a thermally conductive element that extends through an aperture of the first printed circuit board and is thermally coupled at the second printed circuit board. The thermally conductive element conducts heat generated by the circuitry of the second printed circuit board to the rear housing portion to dissipate the heat from the sensing device.

20 Claims, 4 Drawing Sheets (51) Int. Cl.
*G01S 7/481* (2006.01)
*G01S 7/02* (2006.01)

(52) U.S. Cl.
CPC .... *G01S 7/027* (2021.05); *H05K 2201/09063* (2013.01); *H05K 2201/10189* (2013.01)

(56) References Cited

U.S. PATENT DOCUMENTS

| | | | |
|---|---|---|---|
| 5,550,677 A | 8/1996 | Schofield et al. | |
| 5,670,935 A | 9/1997 | Schofield et al. | |
| 5,760,962 A | 6/1998 | Schofield et al. | |
| 5,786,772 A | 7/1998 | Schofield et al. | |
| 5,796,094 A | 8/1998 | Schofield et al. | |
| 5,872,332 A | 2/1999 | Verma | |
| 5,877,897 A | 3/1999 | Schofield et al. | |
| 5,929,786 A | 7/1999 | Schofield et al. | |
| 5,949,331 A | 9/1999 | Schofield et al. | |
| 5,978,017 A | 11/1999 | Tino | |
| 6,151,065 A | 11/2000 | Steed et al. | |
| 6,201,642 B1 | 3/2001 | Bos | |
| 6,222,447 B1 | 4/2001 | Schofield et al. | |
| 6,302,545 B1 | 10/2001 | Schofield et al. | |
| 6,396,397 B1 | 5/2002 | Bos et al. | |
| 6,483,101 B1 | 11/2002 | Webster | |
| 6,490,161 B1* | 12/2002 | Johnson | H01L 23/433 |
| | | | 257/E23.09 |
| 6,498,620 B2 | 12/2002 | Schofield et al. | |
| 6,523,964 B2 | 2/2003 | Schofield et al. | |
| 6,580,611 B1* | 6/2003 | Vandentop | H01L 23/367 |
| | | | 257/713 |
| 6,587,186 B2 | 7/2003 | Bamji et al. | |
| 6,611,202 B2 | 8/2003 | Schofield et al. | |
| 6,636,258 B2 | 10/2003 | Strumolo | |
| 6,674,895 B2 | 1/2004 | Rafii et al. | |
| 6,678,039 B2 | 1/2004 | Charbon | |
| 6,690,268 B2 | 2/2004 | Schofield et al. | |
| 6,690,354 B2 | 2/2004 | Sze | |
| 6,710,770 B2 | 3/2004 | Tomasi et al. | |
| 6,717,610 B1 | 4/2004 | Bos et al. | |
| 6,757,109 B2 | 6/2004 | Bos | |
| 6,802,617 B2 | 10/2004 | Schofield et al. | |
| 6,806,452 B2 | 10/2004 | Bos et al. | |
| 6,807,061 B1* | 10/2004 | Harris | H01L 23/3675 |
| | | | 257/E23.101 |
| 6,822,563 B2 | 11/2004 | Bos et al. | |
| 6,824,281 B2 | 11/2004 | Schofield et al. | |
| 6,825,455 B1 | 11/2004 | Schwarte | |
| 6,876,775 B2 | 4/2005 | Torunoglu | |
| 6,882,287 B2 | 4/2005 | Schofield | |
| 6,891,563 B2 | 5/2005 | Schofield et al. | |
| 6,906,793 B2 | 6/2005 | Bamji et al. | |
| 6,919,549 B2 | 7/2005 | Bamji et al. | |
| 6,946,978 B2 | 9/2005 | Schofield | |
| 7,005,974 B2 | 2/2006 | McMahon et al. | |
| 7,038,577 B2 | 5/2006 | Pawlicki et al. | |
| 7,053,357 B2 | 5/2006 | Schwarte | |
| 7,072,185 B1* | 7/2006 | Belady | G06F 1/189 |
| | | | 257/E23.105 |
| 7,145,519 B2 | 12/2006 | Takahashi et al. | |
| 7,157,685 B2 | 1/2007 | Bamji et al. | |
| 7,161,616 B1 | 1/2007 | Okamoto et al. | |
| 7,176,438 B2 | 2/2007 | Bamji et al. | |
| 7,203,356 B2 | 4/2007 | Gokturk et al. | |
| 7,212,663 B2 | 5/2007 | Tomasi | |
| 7,230,640 B2 | 6/2007 | Regensburger et al. | |
| 7,248,283 B2 | 7/2007 | Takagi et al. | |
| 7,268,425 B2* | 9/2007 | Mallik | H01L 23/13 |
| | | | 257/E23.101 |
| 7,283,213 B2 | 10/2007 | O'Connor et al. | |
| 7,289,328 B2* | 10/2007 | Belady | H05K 7/20436 |
| | | | 361/710 |
| 7,295,229 B2 | 11/2007 | Kumata et al. | |
| 7,301,466 B2 | 11/2007 | Asai | |
| 7,310,431 B2 | 12/2007 | Gokturk et al. | |
| 7,321,111 B2 | 1/2008 | Bamji et al. | |
| 7,340,077 B2 | 3/2008 | Gokturk et al. | |
| 7,352,454 B2 | 4/2008 | Bamji et al. | |
| 7,375,803 B1 | 5/2008 | Bamji | |
| 7,379,100 B2 | 5/2008 | Gokturk et al. | |
| 7,379,163 B2 | 5/2008 | Rafii et al. | |
| 7,405,812 B1 | 7/2008 | Bamji | |
| 7,408,627 B2 | 8/2008 | Bamji et al. | |
| 7,456,047 B2* | 11/2008 | Mallik | H01L 25/0655 |
| | | | 257/E23.101 |
| 7,479,986 B2 | 1/2009 | Karaki | |
| 7,480,149 B2 | 1/2009 | DeWard et al. | |
| 7,592,928 B2 | 9/2009 | Chinomi et al. | |
| 7,646,093 B2* | 1/2010 | Braunisch | H05K 1/0204 |
| | | | 438/117 |
| 7,679,915 B2* | 3/2010 | Isomoto | H05K 7/209 |
| | | | 165/185 |
| 7,720,580 B2 | 5/2010 | Higgins-Luthman | |
| 7,855,755 B2 | 12/2010 | Weller et al. | |
| 7,859,565 B2 | 12/2010 | Schofield et al. | |
| 7,881,496 B2 | 2/2011 | Camilleri et al. | |
| 7,932,596 B2* | 4/2011 | Mallik | H01L 23/13 |
| | | | 257/E23.101 |
| 7,965,336 B2 | 6/2011 | Bingle et al. | |
| 8,013,780 B2 | 9/2011 | Lynam | |
| 8,027,029 B2 | 9/2011 | Lu et al. | |
| 8,256,821 B2 | 9/2012 | Lawlor et al. | |
| 8,278,559 B2* | 10/2012 | Loiselet | H01L 23/433 |
| | | | 29/830 |
| 8,542,451 B2 | 9/2013 | Lu et al. | |
| 8,694,224 B2 | 4/2014 | Chundrlik, Jr. et al. | |
| 8,818,042 B2 | 8/2014 | Schofield et al. | |
| 8,886,401 B2 | 11/2014 | Schofield et al. | |
| 8,917,169 B2 | 12/2014 | Schofield et al. | |
| 8,994,878 B2 | 3/2015 | Byrne et al. | |
| 9,036,026 B2 | 5/2015 | Dellantoni et al. | |
| 9,059,127 B1* | 6/2015 | Lamorey | H01L 23/3677 |
| 9,068,390 B2 | 6/2015 | Ihlenburg et al. | |
| 9,077,098 B2 | 7/2015 | Latunski | |
| 9,077,962 B2 | 7/2015 | Shi et al. | |
| 9,090,234 B2 | 7/2015 | Johnson et al. | |
| 9,092,986 B2 | 7/2015 | Salomonsson et al. | |
| 9,126,525 B2 | 9/2015 | Lynam et al. | |
| 9,140,789 B2 | 9/2015 | Lynam | |
| 9,146,898 B2 | 9/2015 | Ihlenburg et al. | |
| 9,174,574 B2 | 11/2015 | Salomonsson | |
| 9,190,399 B2* | 11/2015 | Lamorey | H01L 25/50 |
| 9,205,776 B2 | 12/2015 | Turk | |
| 9,209,141 B2* | 12/2015 | Lamorey | H05K 1/0216 |
| 9,233,641 B2 | 1/2016 | Sesti et al. | |
| 9,252,101 B2* | 2/2016 | Lamorey | H01L 23/3672 |
| 9,277,104 B2 | 3/2016 | Sesti et al. | |
| 9,292,981 B2* | 3/2016 | Kimura | G06F 1/18 |
| 9,397,078 B1* | 7/2016 | Chandolu | H01L 25/18 |
| 9,564,417 B2* | 2/2017 | Byun | H01L 23/367 |
| 9,575,160 B1 | 2/2017 | Davis et al. | |
| 9,596,387 B2 | 3/2017 | Achenbach et al. | |
| 9,599,702 B1 | 3/2017 | Bordes et al. | |
| 9,621,769 B2 | 4/2017 | Mai et al. | |
| 9,689,967 B1 | 6/2017 | Stark et al. | |
| 9,753,121 B1 | 9/2017 | Davis et al. | |
| 9,871,971 B2 | 1/2018 | Wang et al. | |
| 9,896,039 B2 | 2/2018 | Achenbach et al. | |
| 9,935,058 B2* | 4/2018 | Lamorey | H01L 23/3672 |
| 10,071,687 B2 | 9/2018 | Ihlenburg et al. | |
| 10,076,063 B2* | 9/2018 | Matsuda | G11B 33/1406 |
| 10,085,364 B2* | 9/2018 | Voss | H05K 7/20436 |
| 10,099,614 B2 | 10/2018 | Diessner | |
| 10,142,532 B2 | 11/2018 | Mleczko | |
| 10,207,646 B2 | 2/2019 | Oh | |
| 10,274,812 B1 | 4/2019 | Chen | |
| 10,314,160 B2* | 6/2019 | Suzuki | H05K 7/20163 |
| 10,524,390 B2* | 12/2019 | Suzuki | H05K 7/20472 |
| 10,553,544 B2* | 2/2020 | Lamorey | H01L 25/18 |
| 10,834,825 B1* | 11/2020 | Bedinger | H05K 3/0047 |
| 10,855,890 B2 | 12/2020 | Mleczko et al. | |
| 10,869,383 B2* | 12/2020 | Suzuki | H05K 5/0008 |
| 10,899,275 B2 | 1/2021 | Lu et al. | |
| 11,049,819 B2* | 6/2021 | Lamorey | H01L 23/552 |

(56) References Cited

U.S. PATENT DOCUMENTS

| | | |
|---|---|---|
| 11,153,964 B2 * | 10/2021 | Suzuki .................. H05K 1/18 |
| 2003/0090569 A1 | 5/2003 | Poechmueller |
| 2004/0075870 A1 | 4/2004 | Karaki |
| 2004/0077118 A1 | 4/2004 | Prior |
| 2004/0169771 A1 | 9/2004 | Washington et al. |
| 2009/0113705 A1 * | 5/2009 | McKinley ............ H05K 1/0353 29/830 |
| 2009/0122494 A1 * | 5/2009 | Schmidt ............. H05K 7/20854 29/829 |
| 2009/0244361 A1 | 10/2009 | Gebauer et al. |
| 2009/0295181 A1 | 12/2009 | Lawlor et al. |
| 2010/0245066 A1 | 9/2010 | Sarioglu et al. |
| 2011/0025850 A1 | 2/2011 | Maekawa et al. |
| 2011/0199748 A1 * | 8/2011 | Kagawa ............. H05K 7/20436 361/796 |
| 2011/0248389 A1 * | 10/2011 | Yorita ................. H01L 25/0652 257/659 |
| 2011/0298925 A1 | 12/2011 | Inoue et al. |
| 2013/0002873 A1 | 1/2013 | Hess |
| 2013/0141578 A1 | 6/2013 | Chundrlik, Jr. et al. |
| 2013/0215271 A1 | 8/2013 | Lu |
| 2013/0222593 A1 | 8/2013 | Byrne et al. |
| 2013/0242099 A1 | 9/2013 | Sauer et al. |
| 2013/0258077 A1 | 10/2013 | Bally et al. |
| 2013/0278769 A1 | 10/2013 | Nix et al. |
| 2013/0298866 A1 | 11/2013 | Vogelbacher |
| 2013/0300869 A1 | 11/2013 | Lu et al. |
| 2013/0314503 A1 | 11/2013 | Nix et al. |
| 2014/0005907 A1 | 1/2014 | Bajpai |
| 2014/0025240 A1 | 1/2014 | Steigerwald et al. |
| 2014/0028852 A1 | 1/2014 | Rathi |
| 2014/0049646 A1 | 2/2014 | Nix |
| 2014/0052340 A1 | 2/2014 | Bajpai |
| 2014/0067206 A1 | 3/2014 | Pflug |
| 2014/0085472 A1 | 3/2014 | Lu et al. |
| 2014/0098229 A1 | 4/2014 | Lu et al. |
| 2014/0104184 A1 | 4/2014 | Meador et al. |
| 2014/0104426 A1 | 4/2014 | Boegel et al. |
| 2014/0138140 A1 | 5/2014 | Sigle |
| 2014/0139676 A1 | 5/2014 | Wierich |
| 2014/0152825 A1 | 6/2014 | Schaffner |
| 2014/0160276 A1 | 6/2014 | Pliefke et al. |
| 2014/0160284 A1 | 6/2014 | Achenbach et al. |
| 2014/0160291 A1 | 6/2014 | Schaffner |
| 2014/0168415 A1 | 6/2014 | Ihlenburg et al. |
| 2014/0168437 A1 | 6/2014 | Rother et al. |
| 2014/0211009 A1 | 7/2014 | Fursich |
| 2014/0211421 A1 * | 7/2014 | Mishrikey ............ H05K 1/0209 361/717 |
| 2014/0218535 A1 | 8/2014 | Ihlenburg et al. |
| 2014/0226012 A1 | 8/2014 | Achenbach |
| 2014/0232869 A1 | 8/2014 | May et al. |
| 2014/0247352 A1 | 9/2014 | Rathi et al. |
| 2014/0247354 A1 | 9/2014 | Knudsen |
| 2014/0247355 A1 | 9/2014 | Ihlenburg |
| 2014/0293042 A1 | 10/2014 | Lynam |
| 2014/0293057 A1 | 10/2014 | Wierich |
| 2014/0307095 A1 | 10/2014 | Wierich |
| 2014/0309884 A1 | 10/2014 | Wolf |
| 2014/0313339 A1 | 10/2014 | Diessner |
| 2014/0319390 A1 * | 10/2014 | Strauss ................ H05K 1/0272 29/829 |
| 2014/0320636 A1 | 10/2014 | Bally et al. |
| 2014/0320658 A1 | 10/2014 | Pliefke |
| 2014/0327772 A1 | 11/2014 | Sahba |
| 2014/0327774 A1 | 11/2014 | Lu et al. |
| 2014/0336876 A1 | 11/2014 | Gieseke et al. |
| 2014/0340510 A1 | 11/2014 | Ihlenburg et al. |
| 2014/0347486 A1 | 11/2014 | Okouneva |
| 2014/0373345 A1 | 12/2014 | Steigerwald |
| 2015/0015713 A1 | 1/2015 | Wang et al. |
| 2015/0029337 A1 | 1/2015 | Uchiyama et al. |
| 2015/0054961 A1 | 2/2015 | Saitoh et al. |
| 2015/0070557 A1 | 3/2015 | Petty et al. |
| 2015/0124098 A1 | 5/2015 | Winden et al. |
| 2015/0205186 A1 | 7/2015 | Park et al. |
| 2015/0222795 A1 | 8/2015 | Sauer et al. |
| 2015/0243609 A1 * | 8/2015 | Lamorey ............. H01L 25/165 361/717 |
| 2015/0254911 A1 * | 9/2015 | Kimura .................. G06F 11/18 701/50 |
| 2015/0266430 A1 | 9/2015 | Mleczko et al. |
| 2015/0327398 A1 | 11/2015 | Achenbach et al. |
| 2015/0365569 A1 | 12/2015 | Mai et al. |
| 2016/0037028 A1 | 2/2016 | Biemer |
| 2016/0086917 A1 * | 3/2016 | Byun .................... H01L 23/367 257/717 |
| 2016/0191863 A1 | 6/2016 | Minikey, Jr. et al. |
| 2016/0243987 A1 | 8/2016 | Kendall |
| 2016/0268716 A1 | 9/2016 | Conger et al. |
| 2016/0286103 A1 | 9/2016 | Van Dan Elzen |
| 2016/0307818 A1 * | 10/2016 | Kawase ............. H05K 7/20445 |
| 2017/0036600 A1 | 2/2017 | Whitehead et al. |
| 2017/0048463 A1 | 2/2017 | Mleczko |
| 2017/0054881 A1 | 2/2017 | Conger et al. |
| 2017/0133811 A1 | 5/2017 | Conger et al. |
| 2017/0201661 A1 | 7/2017 | Conger |
| 2017/0222311 A1 | 8/2017 | Hess et al. |
| 2017/0254873 A1 | 9/2017 | Koravadi |
| 2017/0276788 A1 | 9/2017 | Wodrich |
| 2017/0280034 A1 | 9/2017 | Hess et al. |
| 2017/0295306 A1 | 10/2017 | Mleczko |
| 2017/0302829 A1 | 10/2017 | Mleczko et al. |
| 2017/0315231 A1 | 11/2017 | Wodrich |
| 2017/0356994 A1 | 12/2017 | Wodrich et al. |
| 2018/0015875 A1 | 1/2018 | May et al. |
| 2018/0027151 A1 | 1/2018 | Kazama et al. |
| 2018/0045812 A1 | 2/2018 | Hess |
| 2018/0072239 A1 | 3/2018 | Wienecke et al. |
| 2018/0098033 A1 | 4/2018 | Mleczko et al. |
| 2018/0231635 A1 | 8/2018 | Woehlte |
| 2018/0241917 A1 | 8/2018 | Zhang et al. |
| 2019/0121051 A1 | 4/2019 | Byrne et al. |
| 2019/0124238 A1 | 4/2019 | Byrne et al. |
| 2019/0124243 A1 | 4/2019 | Mleczko et al. |
| 2019/0306966 A1 | 10/2019 | Byrne et al. |
| 2019/0339382 A1 | 11/2019 | Hess et al. |
| 2020/0001787 A1 | 1/2020 | Lu et al. |
| 2020/0010024 A1 | 1/2020 | Sesti et al. |
| 2020/0033549 A1 | 1/2020 | Liu et al. |
| 2020/0219836 A1 * | 7/2020 | Maki ................. H01L 27/14636 |
| 2020/0288049 A1 | 9/2020 | White |
| 2021/0109201 A1 * | 4/2021 | Cao .................... H01L 31/107 |
| 2022/0078944 A1 * | 3/2022 | Lu ..................... H05K 7/20436 |

\* cited by examiner

VEHICULAR SENSING DEVICE WITH COOLING FEATURE

CROSS REFERENCE TO RELATED APPLICATION

The present application claims the filing benefits of U.S. provisional application Ser. No. 62/750,894, filed Oct. 26, 2018, which is hereby incorporated herein by reference in its entirety.

FIELD OF THE INVENTION

The present invention relates generally to a vehicle sensing system for a vehicle and, more particularly, to a vehicle sensing system that utilizes one or more radar sensors and/or cameras at a vehicle.

BACKGROUND OF THE INVENTION

Use of imaging and radar sensors in vehicle sensing systems is common and known. Examples of such known systems are described in U.S. Pat. No. 8,013,780, which is hereby incorporated herein by reference in its entirety.

SUMMARY OF THE INVENTION

The present invention provides a driving assistance system or sensing system or vehicle control system for a vehicle that utilizes one or more sensors, such as radar sensors or image sensors or lidar sensors, to sense regions exterior of the vehicle. The sensor includes a thermal element that is thermally coupled at a circuit board of the sensor (that has an integrated circuit or processor thereat) to draw heat (that is generated by operation of the sensor) away from the circuit board and to a distal rear housing portion of the sensor. The thermal element may be part of the rear housing portion and both may comprise metallic thermally conductive materials.

These and other objects, advantages, purposes and features of the present invention will become apparent upon review of the following specification in conjunction with the drawings.

BRIEF DESCRIPTION OF THE DRAWINGS

FIG. 4 is a plan view of the connector circuit board, showing the aperture or opening for the thermal element to pass through.

DESCRIPTION OF THE PREFERRED EMBODIMENTS

A vehicle sensing system and/or driver assist system and/or driving assist system and/or object detection system and/or alert system operates to capture sensing data exterior of the vehicle and may process the captured data to detect objects at or near the vehicle and in the predicted path of the vehicle, such as to assist a driver of the vehicle or a control for an autonomous vehicle in maneuvering the vehicle in a forward or rearward direction. The system includes a processor that is operable to receive sensing data from one or more sensors and provide an output, such as an alert or control of a vehicle system.

Figure 1:
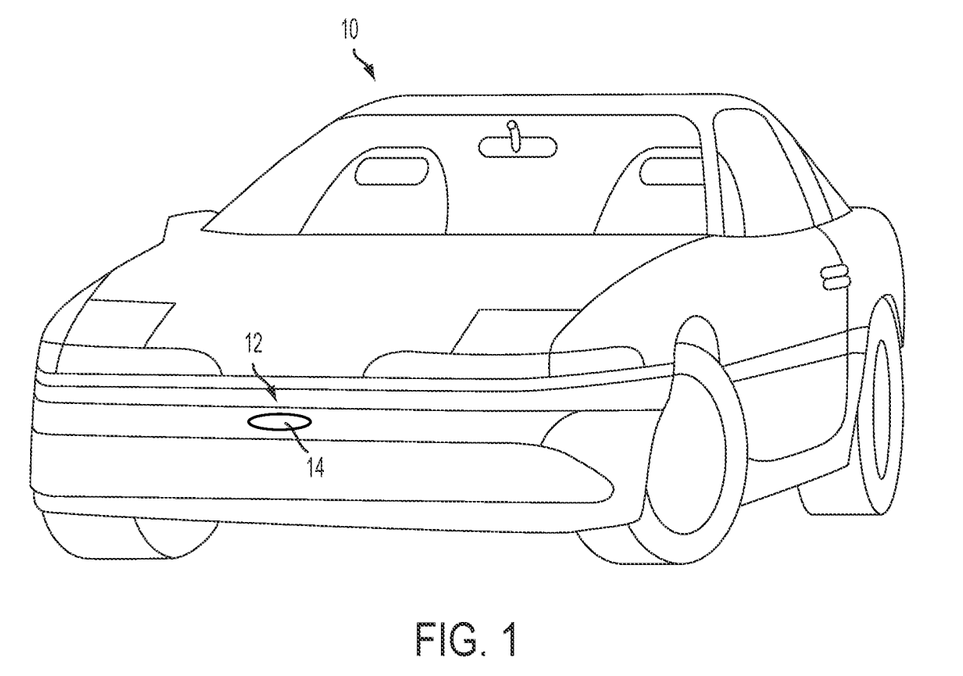
FIG. 1 is a perspective view of a vehicle with a sensing system that incorporates a radar sensor in accordance with the present invention.

Referring now to the drawings and the illustrative embodiments depicted therein, a vehicle 10 (FIG. 1) includes an driving assistance system or sensing system 12 that includes at least one radar sensor unit, such as a forward facing radar sensor unit 14 (and the system may optionally include multiple exterior facing sensors, such as cameras or other sensors, such as a rearward facing sensor at the rear of the vehicle, and a sideward/rearward facing sensor at respective sides of the vehicle), which senses regions exterior of the vehicle. The sensing system 12 includes a control or electronic control unit (ECU) or processor that is operable to process data captured by the sensor or sensors and may detect objects or the like. The data transfer or signal communication from the sensor to the ECU may comprise any suitable data or communication link, such as a vehicle network bus or the like of the equipped vehicle.

The radar sensor or sensors of the driving assist system may be used in conjunction with a plurality of image sensors mounted at the equipped vehicle and/or with at least one lidar sensor also mounted (along with the image sensors and the radar sensor) at the equipped vehicle. Image data and/or radar data and/or lidar data may be provided to a central electronic control unit (ECU) or module for processing thereat. The ECU includes at least one processor that processes the captured/sensed data, whereby one or more functions or systems (such as a braking system and/or steering system and/or the like) of the vehicle is controlled responsive to processing of the captured/sensed data.

Modern ADAS applications such as RADAR, LIDAR or cameras are built on high-performance integrated circuits (ICs). Such ICs can generate heat which needs to be transferred out of the sensor and housing to ensure compliance requirements. Quite often such vehicular sensing systems are built with multiple PCBs. In some cases, the hot-spot is located on the PCB which is not directly adjacent to the rear housing, which can be out of metal and used as heat sink.

The radar sensor of the vehicular sensing system includes a plurality of transmitter antennas 30 and a plurality of receiver antennas 32, which may be disposed on a printed circuit board (PCB) that includes associated circuitry. The sensor includes a thermally conductive element that extends or protrudes from (or is part of) the rear housing (e.g., a metallic rear housing) and that contacts and is thermally coupled with the rear of a printed circuit board that has circuitry disposed thereat that generates heat during operation of the sensor.

Figure 2:
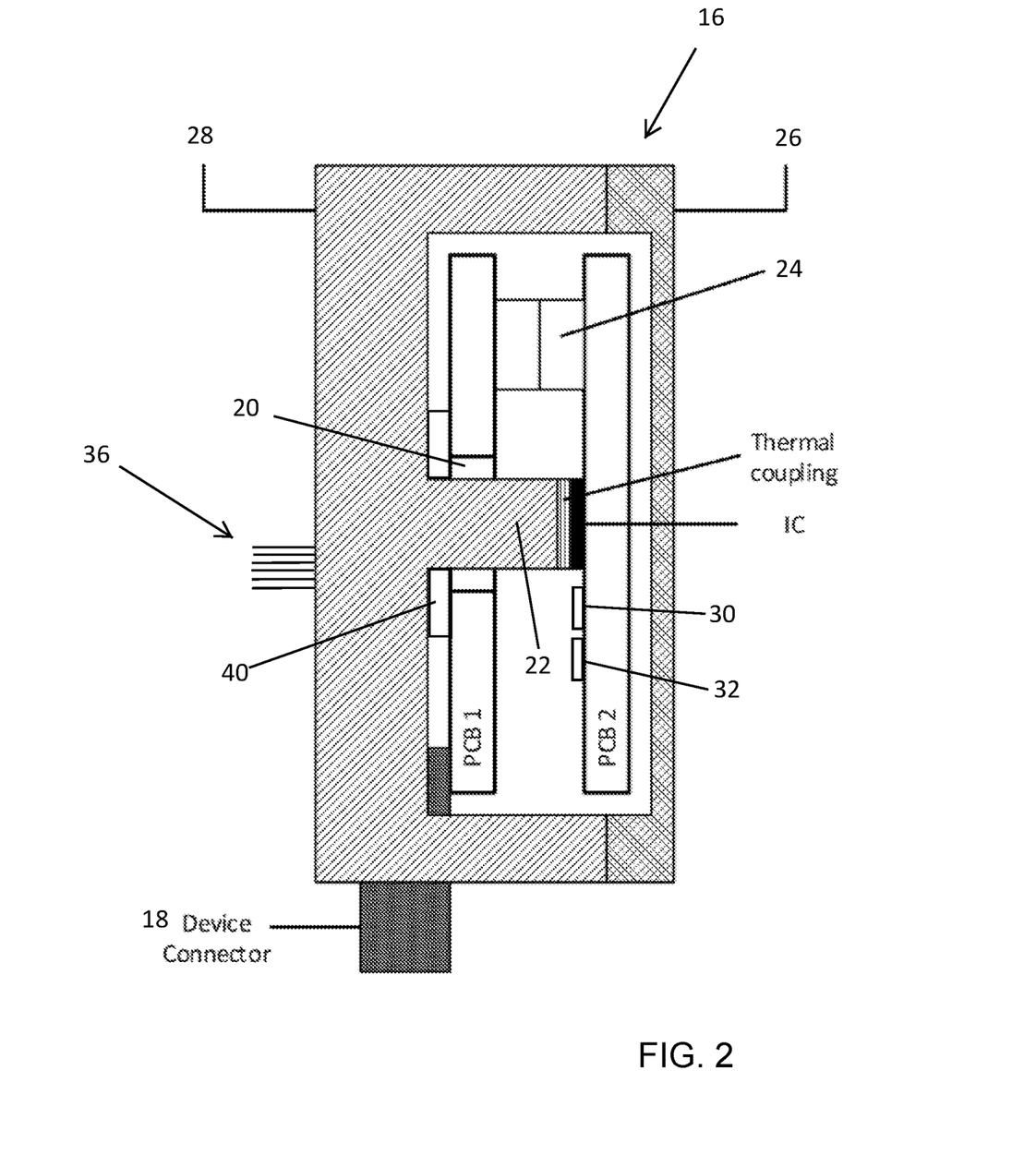
FIG. 2 is a sectional view of the radar sensor.

As shown in FIG. 2, a radar sensor 16 has two printed circuit boards (PCB1 and PCB2), with one printed circuit board (PCB1) having a connector 18 for electrically connecting the sensor to a wire or lead of the vehicle and having an aperture or cutout 20 therethrough for the thermal element or pedestal 22 to pass. The other printed circuit board (PCB2) has a processor and/or integrated circuit (IC) or processor or processing chip that generates heat when operating. The PCB2 is electrically connected to PCB1 via an electrical connector 24 (such as a flexible ribbon cable connector or other suitable connector that electrically connects circuitry of PCB2 to circuitry of PCB1). The front housing portion 26 (e.g., a plastic housing portion) may be adhesively attached or mated or joined or may be welded or fastened (such as via one or more fasteners) to the rear housing portion 28 (e.g., a metallic housing portion comprising, for example, aluminum, zinc, magnesium or the like or alloys thereof), and optionally with a gasket or sealing element to seal the housing with a cavity defined or formed therein. Also, the PCB1 and PCB2 may be attached at the front or rear housing portion via any suitable means, such as adhesive or fasteners or the like. For example, the printed circuit board PCB1 may be fastened at the rear housing (such as to the rear wall of the rear housing) while the other printed circuit board PCB2 may be attached at the front housing portion.

Figure 3:
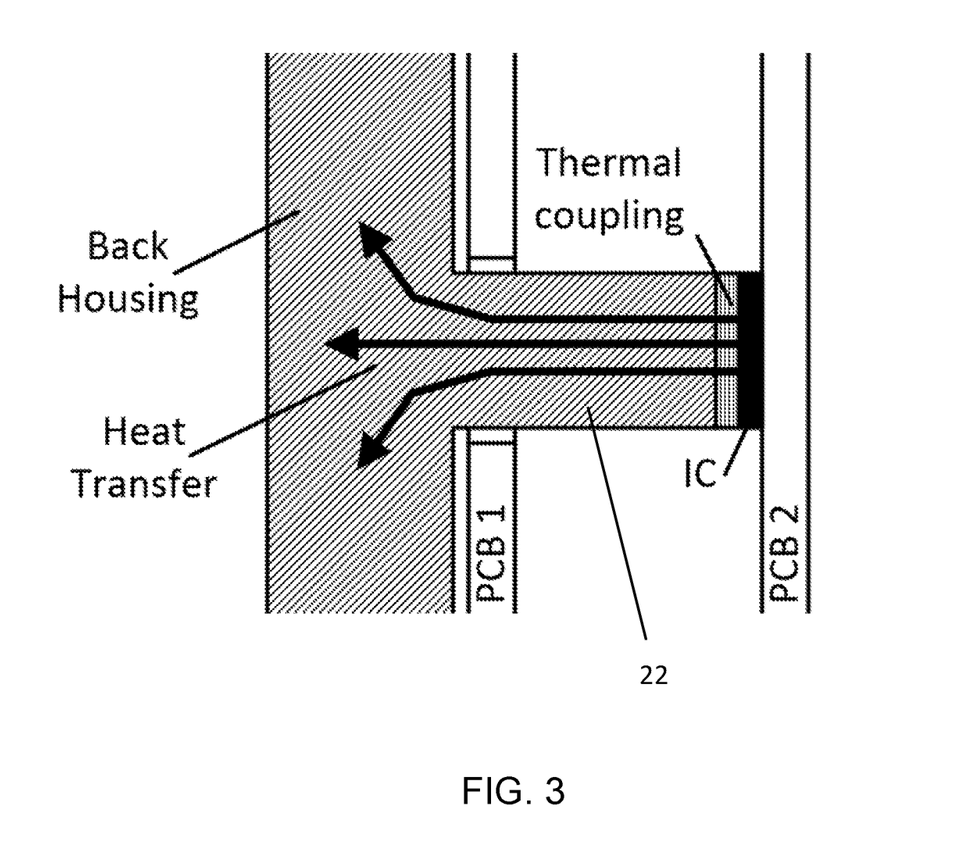
FIG. 3 is an enlarged view of the thermal element, showing the heat transfer from the circuit board to the rear housing of the sensor.

In the illustrated embodiment, the thermally conductive pedestal 22 extends from the inner surface of the rear housing 28 (and may be formed as part of the rear housing or may be thermally coupled with the rear housing). The distal end of the thermally conductive pedestal (that is distal from the rear wall of the rear housing) is thermally coupled at PCB2 and at the circuitry where the most heat is generated during operation of the sensor. The distal end of the thermally conductive pedestal may be coupled to the printed circuit board PCB2 via a thermally conductive material. The thermally conductive material that thermally couples the pedestal to the rear side of the printed circuit board PCB2 (or to a component or circuitry disposed at the printed circuit board, such as at the rear side of the printed circuit board) may comprise a thermally conductive pliable material or a thermally conductive paste or other suitable material that enhances contact and thermal conductivity between the printed circuit board PCB2 and the thermally conductive pedestal.

During operation of the sensor, heat generated at the circuitry on PCB2 is transferred from PCB2 through the thermal coupling material and along the thermally conductive pedestal to the rear wall of the rear housing. Optionally, the rear housing may include a heat sink at the rear wall of the rear housing (such as a plurality of heat dissipating fins 36 or vanes or protruding elements formed at the exterior or outermost surface of the rear wall of the rear housing) to enhance heat dissipation from the thermal coupler at the rear housing of the sensor.

Figure 4:
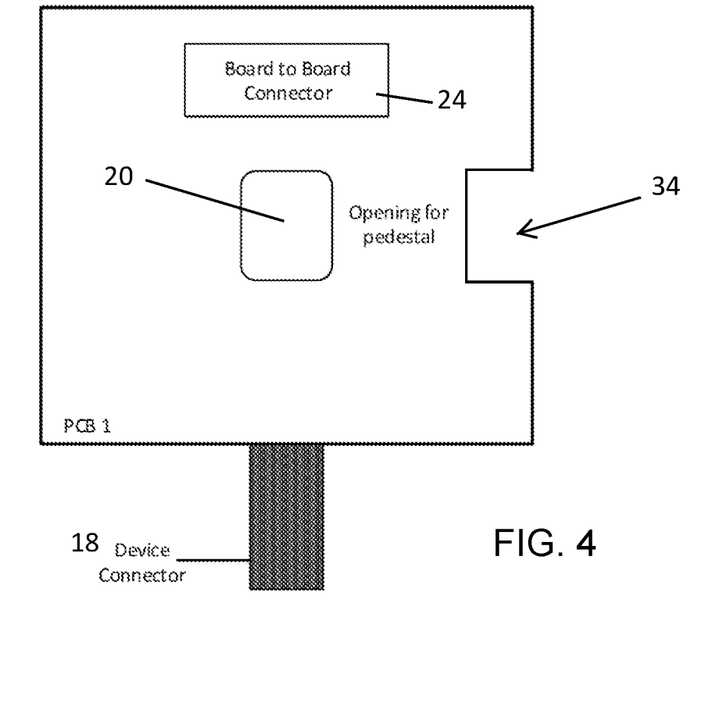
Figure 5:
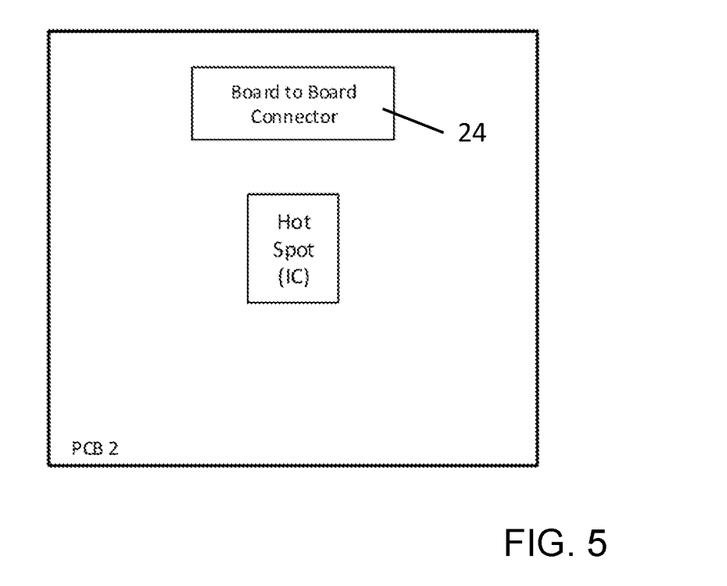
FIG. 5 is a plan view of the second circuit board, showing the IC disposed thereat.

Thus, the PCB(s) of the sensor that is/are between the hot spot(s) (e.g., at one or more ICs at PCB2) and the potential heat sink (at the rear wall of the housing) may have a cut out or aperture therethrough, with the aperture being bounded or defined by a portion of the PCB substrate that at least partially circumscribes the cutout and the thermally conductive pedestal passing therethrough. For example, the aperture may comprise a cutout or hole 20 (as shown in FIG. 4) drilled or otherwise established through a central or non-peripheral or non-perimeter region of the PCB substrate of PCB1 so that the PCB substrate fully circumscribes the aperture and the thermally conductive pedestal that passes therethrough. Optionally, the aperture may comprise a notch 20, 34 or cutout that extends from or that is adjacent to or at a perimeter or peripheral region of the PCB substrate such that the PCB substrate partially circumscribes the cutout and the thermally conductive pedestal that passes through the cutout. The thermally conductive pedestal passes through the aperture and is thermally coupled to the IC/circuitry (such as via application of a thermal grease or a thermal pad or the like). The generated heat is spread out through the thermal coupling of the IC to the metal pedestal, which may be part of the rear housing. The rear housing can be mounted directly on a metallic part of the car or can be placed in a metallic bracket, such that the heat generated during operation of the sensor is transferred from the IC to the environment.

Although shown and described as being part of a radar sensor, the thermally conductive pedestal may be used for other sensors and/or processors of an automotive driving assistance system or the like. For example, the thermally conductive pedestal may be implemented in a radar sensor, a lidar sensor, a camera, a data processor or processing ECU and/or other sensors and/or processors of the ADAS. FIGS. 2-5 show a radar sensor application. For camera applications, the front housing would include a lens holder and lens, while for LiDAR applications, it would be a front housing (with or without a heating structure) similar to what is shown in FIGS. 2-5. Although the sensor is shown with two PCBs, the sensor may have three PCBs or more, with the thermally conductive pedestal protruding through more than one PCB (each having an aperture formed therethrough to accommodate the pedestal). The shape of the pedestal (i.e., the shape of a cross section of the pedestal taken along a plane that is normal to the longitudinal axis of the pedestal) may be any suitable shape, such as a square shape or a rectangular shape or a circular shape (such as for a pedestal having a cylindrical shape or a conical shape), to enhance or optimize or maximize the amount of metal that is used to transfer the heat out the sensor or device. The shape of the aperture 20 may be selected to correspond with the shape of the pedestal, such as, for example, a rectangular shape as shown in FIG. 4 for a rectangular cross section pedestal, or such as via a circular or oval shape or the like for a cylindrical shaped or conical shaped pedestal.

Although shown as a single pedestal extending from a generally central region of the rear housing and through a generally central region of the PCB1, the pedestal may be elsewhere positioned at the rear wall of the rear housing and may extend through an aperture or cutout correspondingly formed or established through the PCB1. Optionally, two or more pedestals may be provided to thermally couple at two or more components or circuitry elements of the PCB2. Optionally, the one or more pedestals may be formed to provide a locating element or support structure for locating and/or supporting the PCB1 at a desired location in the cavity. For example, the pedestal(s) may have a stepped shape (or a conical shape) with a larger cross dimension closer to the rear wall of the rear housing so that the PCB1 can engage the step 40 (or larger diameter portion) and be located and/or supported at the pedestal(s). The PCB1 may be fastened or secured at the desired or selected location, such as via one or more fasteners or the like attaching the PCB1 to the pedestal or to the rear housing. For applications where there are three or more PCBs, the pedestal(s) may have multiple stepped structure to accommodate and locate the two or more PCBs having an aperture therethrough (and the PCBs may have different sized apertures to engage the different diameter portions of the pedestal or pedestals).

The sensor or sensing system may utilize aspects of the systems described in U.S. Pat. Nos. 9,753,121; 9,689,967; 9,599,702; 9,575,160; 9,146,898; 9,036,026; 8,027,029; 8,013,780; 6,825,455; 7,053,357; 7,408,627; 7,405,812; 7,379,163; 7,379,100; 7,375,803; 7,352,454; 7,340,077; 7,321,111; 7,310,431; 7,283,213; 7,212,663; 7,203,356; 7,176,438; 7,157,685; 6,919,549; 6,906,793; 6,876,775; 6,710,770; 6,690,354; 6,678,039; 6,674,895 and/or 6,587,186, and/or International Publication Nos. WO 2018/007995 and/or WO 2011/090484, and/or U.S. Publication Nos. US-2018-0231635; US-2018-0045812; US-2018-0015875; US-2017-0356994; US-2017-0315231; US-2017-0276788; US-2017-0254873; US-2017-0222311 and/or US-2010-0245066, which are hereby incorporated herein by reference in their entireties.

Optionally, the sensor (such as an image sensor or camera) or sensing system may utilize aspects of the cameras and systems described in U.S. Pat. Nos. 9,621,769; 9,596,387; 9,277,104; 9,077,098; 8,994,878; 8,542,451 and/or 7,965,336, and/or U.S. Publication Nos. US-2009-0244361; US-2013-0242099; US-2014-0373345; US-2015-0124098; US-2015-0222795; US-2015-0327398; US-2016-0243987; US-2016-0268716; US-2016-0286103; US-2016-0037028; US-2017-0054881; US-2017-0133811; US-2017-0201661; US-2017-0280034; US-2017-0295306; US-2017-0302829; US-2018-0098033; US-2019-0124238; US-2019-0124243; US-2019-0121051 and/or US-2019-0306966, and/or U.S. patent applications, Ser. No. 16/451,179, filed Jun. 25, 2019, and/or Ser. No. 16/525,666, filed Jul. 30, 2019, which are all hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ™ family of image processing chips (for example, an EYEQ3™, EYEQ4™ or EYEQ5™ image processing chip) available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. Pat. No. 9,126,525, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A radar device for a vehicular sensing system, said radar device comprising:

a housing having a front housing portion and a metallic rear housing portion, wherein said front housing portion and said metallic rear housing portion are joined together to establish a cavity;

a first printed circuit board and a second printed circuit board disposed in the cavity of said housing, wherein said second printed circuit board is electrically connected to said first printed circuit board;

wherein said first printed circuit board has an electrical connector for electrically connecting said radar device to a wire harness of a vehicle when said radar device is disposed at the vehicle, and wherein said first printed circuit board has a notch extending inboard from a peripheral region of said first printed circuit board, and wherein said first printed circuit board only partially circumscribes said notch;

wherein said second printed circuit board has circuitry disposed thereat, and wherein the circuitry generates heat when said radar device is operating;

a thermally conductive element extending into the cavity from an inner surface of a rear wall of said metallic rear housing portion and spaced from a side wall of said metallic rear housing portion;

wherein said thermally conductive element extends through said notch of said first printed circuit board and is thermally coupled at said second printed circuit board, and wherein said thermally conductive element comprises a stepped shape with a cross dimension at said rear wall of said metallic rear housing portion that is larger than the cross dimension at said second printed circuit board, and wherein said first printed circuit board engages a step of the stepped shape to locate and support said first printed circuit board; and wherein said thermally conductive element conducts the heat generated by the circuitry of said second printed circuit board to said rear wall of said metallic rear housing portion to dissipate the heat from said radar device.

2. The radar device of claim 1, wherein the circuitry of the second printed circuit board that generates the heat when said radar device is operating comprises a data processor chip.

3. The radar device of claim 2, wherein said thermally conductive element thermally couples to the data processor chip of said second printed circuit board.

4. The radar device of claim 1, wherein the circuitry of the second printed circuit board comprises a radar sensor comprising transmitting antennas and receiving antennas.

5. The radar device of claim 1, wherein said thermally conductive element is thermally coupled at said second printed circuit board via a thermally conductive material.

6. The radar device of claim 5, wherein the thermally conductive material comprises a thermally conductive pliable material.

7. The radar device of claim 5, wherein the thermally conductive material comprises a thermally conductive paste.

8. The radar device of claim 1, wherein said thermally conductive element comprises a rectangular-shaped element.

9. The radar device of claim 1, wherein said thermally conductive element comprises a metallic thermally conductive element.

10. The radar device of claim 9, wherein said thermally conductive element is formed integrally with said metallic rear housing portion.

11. The radar device of claim 1, wherein said metallic rear housing portion comprises a plurality of heat dissipating elements protruding from an outermost surface of said rear wall to enhance heat dissipation at said rear wall of said metallic rear housing portion.

12. The radar device of claim 1, wherein said metallic rear housing portion is formed of at least one selected from the group consisting of zinc, aluminum and magnesium.

13. A lidar device for a vehicular sensing system, said lidar device comprising:
- a housing having a front housing portion and a metallic rear housing portion, wherein said front housing portion and said metallic rear housing portion are joined together to establish a cavity;
- a first printed circuit board and a second printed circuit board disposed in the cavity of said housing, wherein said second printed circuit board is electrically connected to said first printed circuit board;
- wherein said first printed circuit board has an electrical connector for electrically connecting said lidar device to a wire harness of a vehicle when said lidar device is disposed at the vehicle, and wherein said first printed circuit board has a notch extending inboard from a peripheral region of said first printed circuit board, and wherein said first printed circuit board only partially circumscribes said notch;
- wherein said second printed circuit board has circuitry disposed thereat, and wherein the circuitry generates heat when said lidar device is operating;
- wherein the circuitry that generates the heat when said lidar device is operating comprises a data processor chip;
- a metallic thermally conductive element extending into the cavity from an inner surface of a rear wall of said metallic rear housing portion and spaced from a side wall of said metallic rear housing portion;
- wherein said metallic thermally conductive element extends through said notch of said first printed circuit board and is thermally coupled at said second printed circuit board, and wherein said metallic thermally conductive element comprises a stepped shape with a cross dimension at said rear wall of said metallic rear housing portion that is larger than the cross dimension at said second printed circuit board, and wherein said first printed circuit board engages a step of the stepped shape to locate and support said first printed circuit board;
- wherein said metallic thermally conductive element conducts the heat generated by the circuitry of said second printed circuit board to said rear wall of said metallic rear housing portion to dissipate the heat from said lidar device; and
- wherein said metallic thermally conductive element is thermally coupled at said second printed circuit board via a thermally conductive paste.

14. The lidar device of claim 13, wherein said metallic thermally conductive element is formed integrally with said metallic rear housing portion.

15. The lidar device of claim 13, wherein said metallic rear housing portion comprises a plurality of heat dissipating elements protruding from an outermost surface of said rear wall to enhance heat dissipation at said rear wall of said metallic rear housing portion.

16. The lidar device of claim 13, wherein said metallic thermally conductive element thermally couples to the data processor chip of said second printed circuit board.

17. A radar device for a vehicular sensing system, said radar device comprising:
- a housing having a front housing portion and a metallic rear housing portion, wherein said front housing portion and said metallic rear housing portion are joined together to establish a cavity;
- a first printed circuit board and a second printed circuit board disposed in the cavity of said housing, wherein said second printed circuit board is electrically connected to said first printed circuit board;
- wherein said first printed circuit board has an electrical connector for electrically connecting said radar device to a wire harness of a vehicle when said radar device is disposed at the vehicle, and wherein said first printed circuit board has a notch extending inboard from a peripheral region of said first printed circuit board, and wherein said first printed circuit board only partially circumscribes said notch;
- wherein said second printed circuit board has circuitry disposed thereat, and wherein the circuitry generates heat when said radar device is operating;
- wherein the circuitry that generates the heat when said radar device is operating comprises a data processor chip;
- a metallic thermally conductive element extending into the cavity from an inner surface of a rear wall of said metallic rear housing portion and spaced from a side wall of said metallic rear housing portion;
- wherein said metallic thermally conductive element extends through said notch of said first printed circuit board and is thermally coupled at said second printed circuit board, and wherein said metallic thermally conductive element comprises a stepped shape with a cross dimension at said rear wall of said metallic rear housing portion that is larger than the cross dimension at said second printed circuit board, and wherein said first printed circuit board engages a step of the stepped shape to locate and support said first printed circuit board;
- wherein said metallic thermally conductive element conducts the heat generated by the circuitry of said second printed circuit board to said rear wall of said metallic rear housing portion to dissipate the heat from said radar device; and
- wherein said metallic rear housing portion comprises a plurality of heat dissipating elements protruding from an outermost surface of said rear wall to enhance heat dissipation at said rear wall of said metallic rear housing portion.

18. The radar device of claim 17, wherein said metallic thermally conductive element thermally couples to the data processor chip of said second printed circuit board.

19. The radar device of claim 17, wherein said metallic thermally conductive element is thermally coupled at said second printed circuit board via a thermally conductive material.

20. The radar device of claim 17, wherein said metallic thermally conductive element is formed integrally with said metallic rear housing portion.

* * * * *

UNITED STATES PATENT AND TRADEMARK OFFICE
CERTIFICATE OF CORRECTION

| | |
|---|---|
| PATENT NO. | : 11,683,911 B2 |
| APPLICATION NO. | : 16/662205 |
| DATED | : June 20, 2023 |
| INVENTOR(S) | : Wilhelm Johann Wolfgang Wöhlte |

It is certified that error appears in the above-identified patent and that said Letters Patent is hereby corrected as shown below:

In the Specification

<u>Column 3</u>
Lines 53-54, "notch 20, 34" should be --notch 34--

Signed and Sealed this
Eighteenth Day of July, 2023

Katherine Kelly Vidal
*Director of the United States Patent and Trademark Office*